(12) United States Patent
Fister

(10) Patent No.: US 8,510,692 B2
(45) Date of Patent: Aug. 13, 2013

(54) VERIFICATION SYSTEM AND METHOD USING CONSTRAINED RANDOM TEST PARAMETER SELECTION

(75) Inventor: Zachary Nathan Fister, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 13/248,150

(22) Filed: Sep. 29, 2011

(65) Prior Publication Data

US 2013/0086538 A1    Apr. 4, 2013

(51) Int. Cl.
  *G06F 9/455*   (2006.01)
  *G06F 17/50*   (2006.01)

(52) U.S. Cl.
  USPC ........................................ 716/106

(58) Field of Classification Search
  USPC .................................. 716/106, 136
  See application file for complete search history.

(56) References Cited

U.S. PATENT DOCUMENTS

| | | | |
|---|---|---|---|
| 7,114,111 B2 * | 9/2006 | Noy | 714/738 |
| 8,020,125 B1 * | 9/2011 | Kuehlmann et al. | 716/106 |
| 2010/0275169 A1 * | 10/2010 | Goswami et al. | 716/3 |

OTHER PUBLICATIONS

C. Castro, et al., "Automatic Generation of a Parameter-Domain-Based Functional Input Coverage Model," IEEE 2010 11th Latin America Test Workshop, Mar. 2010, pp. 1-6.
H. Hsueh et al., "Test Directive Generation for Functional Coverage Closure Using Inductive Logic Programming," IEEE 11th International High-Level Design Validation and Test Workshop, Nov. 2006, pp. 11-18.
Y. Guo et al., "Coverage Driven Test Generation Framework for RTL Functional Verification," IEEE 10th International Conference on Computer-Aided Design and Computer Graphics, Oct. 2007, pp. 321-326.

\* cited by examiner

*Primary Examiner* — Vuthe Siek
*Assistant Examiner* — Brian Ngo

(57) ABSTRACT

A software program for verifying a system design having at least one integrated circuit chip. The software program, when executed by a processor, result in obtaining a random value for a variable; selecting an unused value for the variable based upon the random value, the variable not having been assigned the unused value during one or more prior verification tests; and creating a new verification test for the system using the unused value for the variable. In this way, the new verification test is created in which variables falling within a random class are more efficiently used.

13 Claims, 2 Drawing Sheets

VERIFICATION SYSTEM AND METHOD USING CONSTRAINED RANDOM TEST PARAMETER SELECTION

BACKGROUND

1. Field of the Invention

The present invention relates generally to a verification system and method for a design under test, and particularly to such a system and method utilizing constrained random test parameter selection for providing substantially complete design verification more efficiently.

2. Description of the Related Art

Today's application specific integrated circuit (ASIC) designs have become increasingly complex, as they have followed Moore's Law. Moore's Law states that the number of transistors that will fit on an integrated circuit chip will double every eighteen months. This has primarily been driven by advances in circuit fabrication technology, such as optical lithography techniques. For example, ASIC designs in the year 2000 were seen to target 180 nm feature size and were on the order of several hundred thousand gates. In 2010, current designs target the 40 nm feature sizes and are on the order of several million gates. However, empirical data shows that as design complexity has increased, so has the likelihood of chip re-spins. The majority of chip re-spins has been seen to be due to the existence of a programming bug in a digital logic function of the chip which causes the chip to fail to operate correctly and/or produce an incorrect or unintended result. Digital logic functions, such as functions that may appear in an ASIC, are typically defined in source code using a Hardware Description Language (HDL).

With chip complexity increasing, the time for verifying a chip design has played a more prominent role in the development cycle of the chip. Traditionally, directed tests, in which individual functions are exercised using individual test cases, sufficed to completely verify a design, but now, as complexity has increased, more sophisticated testing methods are required.

Directed tests are useful to ensure that the design's basic modes operate as intended and so they are usually the first test cases created. They will point out gross functional bugs, but each only covers a single state or combination of the design parameters. Each design parameter has a valid range that must be tested along with all combinations of the other parameters' ranges to ensure functionality of the design across all scenarios.

Random selection of a design's test parameters frees the verifier from hand-creating each possible test in a directed fashion. However, each variable may have a limited range of valid values, and often each parameter is not independent, so only certain combinations of parameter values may be valid. For these reasons, constrained random (or directed random) methodologies were developed. Constrained random testing is an approach that can increase functional test coverage more efficiently than directed test creation. It also has the benefit of uncovering corner cases, i.e., those situations outside the normal operating conditions of a device, which the verification engineer would not have otherwise conceived.

SystemVerilog, which is an HDL that is based on contributions from several EDA companies, is unique in that it offers both design and verification constructs within a single language. SystemVerilog extends the syntax of the Verilog HDL with additional constructs to support constrained random verification. In particular, SystemVerilog introduces the rand variable type, the constraint, and coverpoint syntax. A rand variable is one for which a random value may be chosen at each simulation invocation. A constraint directs the choice of a random variable's value based on logical conditions. Coverpoints record the selection of these random variables, as well as special combinations of these variables, to record functional coverage. In this manner, test parameters are "randomly" chosen, but within practical constraints established by the coder. This frees the verification engineer from specifically creating directed tests for every possible combination of the random variables, but also avoids invalid combinations that need not be tested. Though the use of constrained random verification in SystemVerilog has been found to be very helpful to a system designer, there are inefficiencies therein that result in a less optimal amount of time needed for testing a chip.

SUMMARY OF THE INVENTION

Example embodiments overcome shortcomings and inefficiencies in existing design verification tools and methodologies and thereby satisfy a significant need for an improved design verification tool using constrained random test parameter selection. In accordance with an example embodiment, a verification tool includes a software program product having instructions which, when executed by a processor, result in obtaining a random value for a variable, determining whether the variable has achieved a predetermined amount of coverage during one or more prior verifications, and upon a negative determination, determining whether the random value was used during the one or more prior verifications. Upon a positive determination that the random value was used, choosing another value for the variable based upon the random value and setting a final value for the variable based upon the another value. Thereafter, the verification tool creates a verification test for a design under test using the final value for the variable. In this way, the remaining unused values of the variable are efficiently chosen for the verification test.

BRIEF DESCRIPTION OF THE DRAWINGS

The above-mentioned and other features and advantages of the various embodiments of the invention, and the manner of attaining them, will become more apparent will be better understood by reference to the accompanying drawings, wherein.

DETAILED DESCRIPTION

Figure 1:
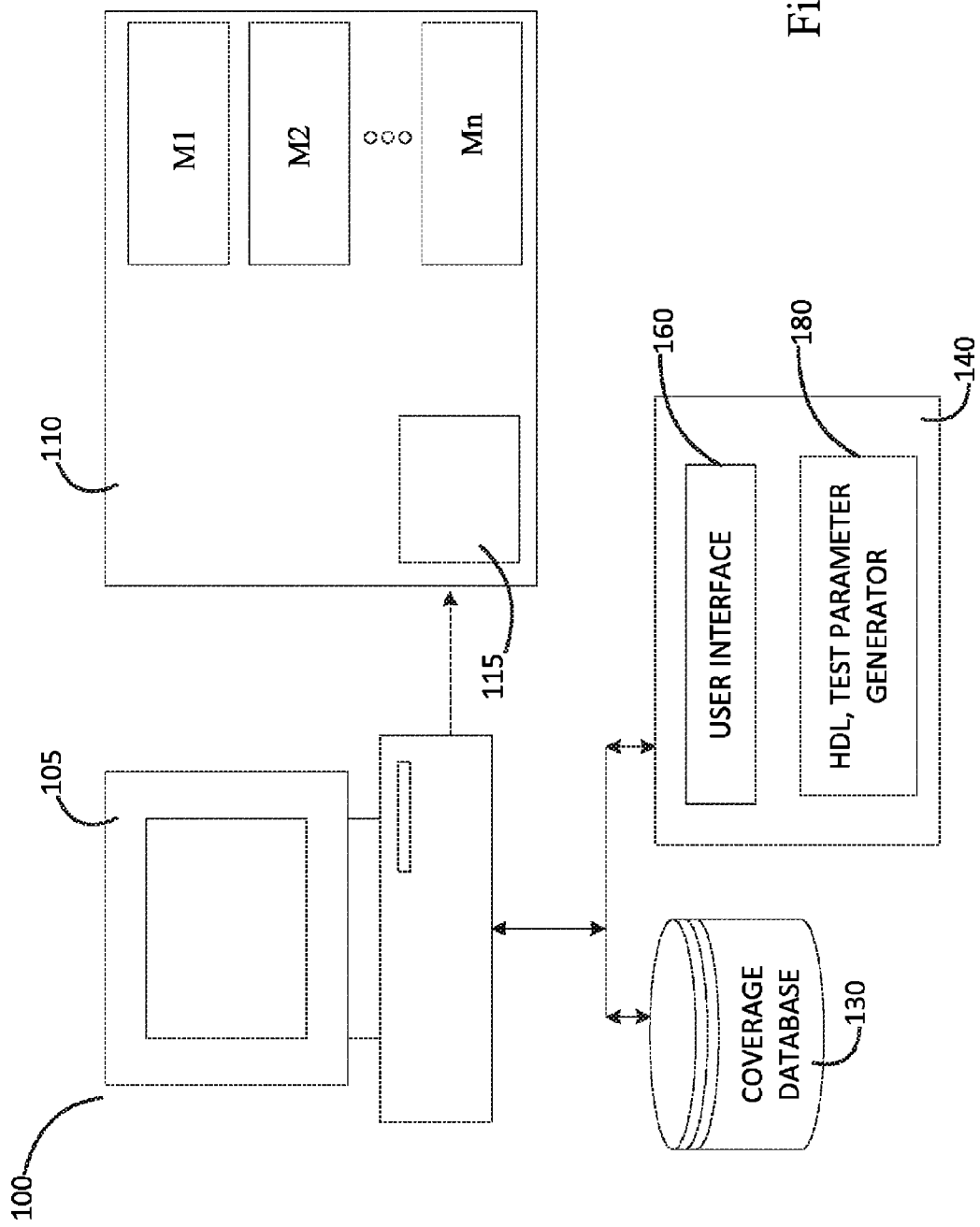
FIG. 1 illustrates a verification system for a design under test in accordance with an example embodiment.

It is to be understood that the invention is not limited in its application to the details of construction and the arrangement of components set forth in the following description or illustrated in the drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

In addition, it should be understood that example embodiments include both hardware and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic based aspects described may be implemented in software. As such, it should be noted that a plurality of hardware and software-based devices, as well as a plurality of different structural components may be utilized to implement an embodiment having the invention. Furthermore, and as described in subsequent paragraphs, the specific mechanical configurations illustrated in the drawings are intended to exemplify example embodiments and that other alternative mechanical configurations are possible.

FIG. 1 illustrates a design verification system 100 according to an example embodiment. System 100 may include a host computing device 105 for controlling test generation. A system 110 to be verified may include one or more system modules M1-Mn, the design for which may be verified using design verification system 100. System 110 may further include at least one integrated circuit 115, which in an example embodiment is an ASIC chip.

Associated with computing device 105 may be a signal coverage database 130 which includes information about signals associated with system 110. The details of signal coverage database 130 will be described in greater detail below.

A memory 140 may be coupled to computing device 105 and include therein user interface software 160 which when executed by a processor within computing device 105 (not shown) provides a user interface for assisting a user to set up and create a verification test for system 110. Also stored in memory 140 may be a HDL and corresponding test parameter generator 180 for generating a verification test for testing the system 110. In accordance with an example embodiment, the HDL and test parameter generator 180 may be SystemVerilog. It is understood, though, that other HDLs and test parameter generators may be used and the present invention is not limited to any particular HDL or test parameter generator.

In SystemVerilog, each time a SystemVerilog class is randomized, the percentage of coverpoint values that have been selected is updated in coverage database 130. At its simplest, once every variable has had every valid value in its constrained range selected, then 100% coverage has been achieved. This is known as the functional coverage of the design, and henceforth will be referred to as "coverage." It is noted that this refers only to coverage of the range of values for all rand variables in the class, and is not to be confused with other coverage metrics such as statement coverage which measures how well each HDL statement is covered.

SystemVerilog has constructs such as the "get_coverage( )" method that allow user code to query the current coverage achieved by the class. However, SystemVerilog does not support querying coverage information on individual variables. Approaches exist for determining coverage on individual variables which may work for variables that have a small range of values. However, for variables with a large range (e.g. with 256 values), this is admittedly a tedious and impractical approach which leads to the creation of a new method.

In implementing a new method in accordance with example embodiments, first, the functional coverage data is conditioned in a format that is more easily manipulated. Functional coverage for all prior verification simulation tests is automatically aggregated into a single file maintained by a ModelSim simulator in the binary Universal Coverage Database (.ucdb) file format. A ModelSim command is used to output the coverage information from .ucdb into text format.

The ModelSim output format is not convenient for automatically parsing the coverage data, so a new Perl script is used to parse the text file and create a new output format for each variable. In the converted format, the first line of each variable's output contains the following: (1) the variable name; (2) the count of possible values; (3) a '1' if all values have been covered or a '0' if uncovered; and (4) the current "covered" count. Following this initial line of output, a '0' or '1' is output for each of the subsequent lines, representing "uncovered" or "covered" for each of the possible values for that variable. With the Perl formatted output, any variable that has uncovered values may be easily identified by the first line and a loop can process the remaining lines to determine which values have been covered versus uncovered.

It was determined that an efficient feedback selection process should be based on selecting variable values one at a time. Typically in a constrained random test environment, the values for all random variables in a SystemVerilog class are selected simultaneously by a single call to the randomize( ) method. Without any arguments, calling class.randomize( ) randomizes all variables of type rand in the class. However, in accordance with an example embodiment, the approach is altered so that variable values are chosen in a more controlled fashion.

Figure 2:
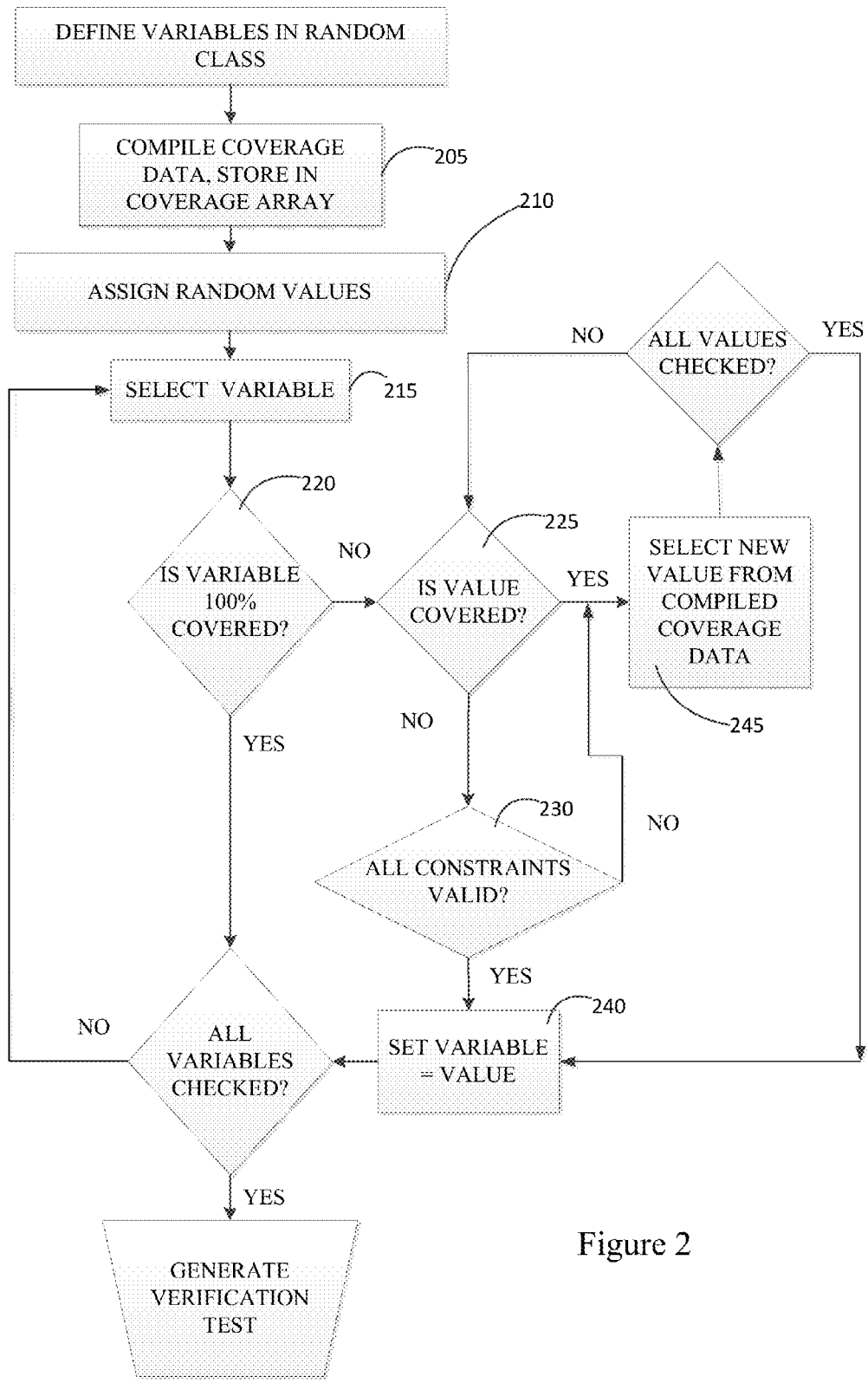
FIG. 2 is a flowchart showing an operation of the verification system of FIG. 1.

The implemented solution, depicted in FIG. 2, turns off randomization on a case-by-case basis for each variable. First, the coverage data is then read at 205 from the coverage database 130 which has accumulated results for the variables in the random class for all previous verification simulation runs. With the newly generated text format produced by the above mentioned script, coverage data is easily parsed by a loop and stored in a coverage array. Command Class.randomize( ) is called and will select random initial values for all variables in the class at 210. Next, a loop processes each variable of interest in the class, one at a time. A variable is selected at 215 and a determination is then made at 220 as to whether the selected variable is 100% covered. If the selected variable is 100% covered, the initial random value assigned is used in the new verification test. If the selected variable is not 100% covered, then it is determined at 225 whether its initial random value has already been used in a prior verification test. In other words, it is determined whether the initial random value has already been covered. If the initial random value of the selected variable has not been covered, and if the random value falls within predetermined constraints at 230, then the random value of the selected variable is used in the new verification test at 240.

However, if the random value has already been covered, then a new value for the selected variable is selected from the coverage array at 245. A new value is selected by using the initial random value of the variable as an index in searching the coverage array. The new value selected is then checked to see whether it is unused/uncovered at 225 as described above. The acts of determining at 225 and selecting a new value at 245 are repeated until an unused/uncovered value is found in the coverage array for the variable.

Once a used value is identified for the variable, another variable is selected at 215 and the above process is performed for the newly selected variable. This repeats for each variable in the random class. In this way, a new verification test is created that utilizes unused values for each random variable in a more efficient manner.

The foregoing description of several methods and an embodiment of the invention has been presented for purposes of illustration. It is not intended to be exhaustive or to limit the invention to the precise steps and/or forms disclosed, and obviously many modifications and variations are possible in light of the above teaching. It is intended that the scope of the invention be defined by the claims appended hereto.

What is claimed is:

1. A computer program product for verifying a design, the product being stored in a non-transitory storage medium and having instructions which, when executed by a processor, result in:
   obtaining a random value for a variable;
   determining whether the variable has achieved a predetermined amount of coverage during one or more prior verification tests;
   upon a negative determination that the variable has not achieved the predetermined amount of coverage, determining whether the random value was used during the one or more prior verification tests;
   upon a positive determination that the random value was used during the one or more prior verification tests, choosing another value for the variable based upon the random value;
   setting a final value for the variable based upon the another value; and
   creating a new verification test for a design to be verified using the final value for the variable;
   further comprising instructions for creatin a database of coverage data for the variable during the one or more prior verification tests, wherein the determining whether the variable has achieved a predetermined amount of coverage comprises accessing the database of coverage data;
   wherein choosing another value comprises using the random value as a starting index for selecting a value in the database of coverage data, determining whether the selected value is an unused value and repeating the selectin the value and the determining whether the selected value is an unused value until the selected value is determined to be an unused value, the unused value being used as the another value.

2. The computer program product of claim 1, further comprising instructions for obtaining a second random value for a second variable and repeating the determining acts and the choosing and setting acts for the second variable.

3. The computer program product of claim 1, wherein determining whether the random value was used during the one or more prior verification tests comprises accessing the database of coverage data.

4. The computer program product of claim 1, further comprising instructions for determining whether the another value meets one or more predetermined constraints, and the setting the final value is performed upon a positive determination that the another value meets the one or more predetermined constraints, the final value being the another value.

5. The computer program product of claim 1, further comprising instructions for repeating each of the acts of determining and the acts of choosing and setting until the new verification test includes all remaining unused values of the variable.

6. A method for verifying a design, comprising:
   obtaining a random value for a variable;
   determining whether the variable has achieved a predetermined amount of coverage during one or more prior verifications;
   upon a negative determination that the variable has not achieved the predetermined amount of coverage, determining whether the random value was used during the one or more prior verifications;
   upon a positive determination that the random value was used during the one or more prior verifications, choosing another value for the variable based upon the random value;
   setting a final value for the variable based upon the another value; and
   creating a verification test for the design using the final value for the variable;
   wherein the determining whether the variable has achieved a predetermined amount of coverage comprises accessing a database of coverage data for the variable,
   wherein choosing another value comprises using the random value as a starting index for selecting a value in the database of coverage data, determining whether the selected value is an unused value and repeating the selectin the value and the determining whether the selected value is an unused value until the selected value is determined to be an unused value, the unused value being used as the another value,
   and wherein at least one of the obtaining, the determining whether the variable has achieved a predetermined amount of coverage, the determining whether the random value was used during the one or more prior verifications, the choosing, the setting and the creating is performed by a computing device.

7. The method of claim 6, further comprising obtaining a second random value for a second variable and repeating the determining acts and the choosing and setting acts for the second variable.

8. The method of claim 6, wherein determining whether the random value was used during the one or more prior verifications comprises accessing the database of coverage data.

9. The method of claim 6, further comprising determining whether the another value meets one or more predetermined constraints, and the setting the final value is performed upon a positive determination that the another value meets the one or more predetermined constraints, the final value being the another value.

10. The method of claim 6, further comprising repeating each of the acts of determining and the acts of choosing and setting until the new verification test includes all remaining unused values of the variable.

11. A software program for verifying a system having at least one integrated circuit chip, the software program being stored in a non-transitory storage medium and including instructions which, when executed by a processor, result in:
   obtaining a random value for a variable;
   determining whether the variable has achieved a predetermined amount of coverage during one or more prior verification tests, comprising accessing a database of coverage data for the variable;
   upon a negative determination that the variable has not achieved the predetermined amount of coverage, determining whether the random value was used during the one or more prior verification tests;
   upon a positive determination that the random value was used during the one or more prior verification tests,
   selecting an unused value for the variable based upon the random value, the variable not having been assigned the unused value during the one or more prior verification tests, comprising using the random value as a starting index for selecting a value in the database of coverage data determining whether the selected value is an unused value and repeating the selecting the value and the determining whether the selected value is an unused value until the selected value is determined to having been unused in the one or more prior verification tests, the selected value being the unused value; and creating a new verification test for the system using the unused value for the variable.

12. The software program of claim 11, further comprising instructions for repeating the obtaining, selecting and creating until all remaining unused values for the variable are used in the new verification test.

13. The software program of claim 11, further comprising confirming that the unused value complies with one or more predetermined constraints and repeating the act of selecting until the unused value selected complies with the one or more predetermined constraints.

* * * * *